(12) United States Patent
Rexberg

(10) Patent No.: US 8,045,642 B2
(45) Date of Patent: Oct. 25, 2011

(54) IQ-MODULATOR PRE-DISTORTION

(75) Inventor: Leonard Rexberg, Hasselby (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 1076 days.

(21) Appl. No.: 11/816,725

(22) PCT Filed: Feb. 24, 2005

(86) PCT No.: PCT/SE2005/000277
§ 371 (c)(1),
(2), (4) Date: Aug. 21, 2007

(87) PCT Pub. No.: WO2006/091132
PCT Pub. Date: Aug. 31, 2006

(65) Prior Publication Data
US 2008/0160935 A1 Jul. 3, 2008

(51) Int. Cl.
*H04L 27/00* (2006.01)
*H04L 25/49* (2006.01)
*H04B 7/00* (2006.01)
*H04B 1/04* (2006.01)
*H03F 1/22* (2006.01)
*H03F 1/26* (2006.01)

(52) U.S. Cl. ........ 375/296; 375/297; 375/298; 375/295; 455/114.3; 455/69; 455/114.2; 330/149; 330/152

(58) Field of Classification Search .......... 375/296–298; 324/76.11, 76.12, 76.22; 455/69, 114.1–114.3; 330/149, 152
See application file for complete search history.

(56) References Cited

U.S. PATENT DOCUMENTS
4,818,931 A * 4/1989 Naegeli et al. ............. 324/76.22
6,236,837 B1 5/2001 Midya
2004/0121741 A1 6/2004 Rashev et al.

FOREIGN PATENT DOCUMENTS
EP 1 359 719 A2 11/2003

OTHER PUBLICATIONS
Ghaderi, M. et al. Adaptive Predistortion Lineariser Using Polynomial Functions. IEEE Proceedings, Apr. 1994; vol. 141, Issue 2.

* cited by examiner

Primary Examiner — Chieh M Fan
Assistant Examiner — Eboni Hughes

(57) ABSTRACT

An IQ-modulator pre-distorter includes means for pre-distorting each IQ-vector by a 2-dimensional linear transformation that depends on the value of the IQ-vector to be pre-distorted. The transformation is based on polynomials in the I- and Q-components. In a preferred embodiment the transformation is based on a 2×2 dimensional lookup table matrix, the elements ($T_{11}$, $T_{12}$, $T_{21}$, $T_{22}$) of which are sampled polynomials in the I- and Q-components of the IQ-vector.

3 Claims, 4 Drawing Sheets

IQ-MODULATOR PRE-DISTORTION

TECHNICAL FIELD

The present invention relates to a method and apparatus for compensating and linearizing a non-linear IQ-modulator (I=In-phase, Q=Quadrature phase).

BACKGROUND

A direct-IQ radio architecture comprises base band data modification, digital-to-analog conversion (DAC), and analog IQ-quadrature modulation to finally bring a complex I+jQ signal to radio frequency (RF). The IQ-modulator exhibits a DC-component, an amplitude error and also a phase error. Both of the branches (I and Q) of the IQ-modulator suffer from this imbalance.

In order to get a better power budget in the direct-IQ radio architecture for digital pre-distortion (to compensate for imperfections of the power amplifier), the analog IQ-modulator is foreseen to be driven by a higher input power. As a result, the mixer parts of the IQ-modulator tend to become inherently non-linear on top of the linear amplitude and phase imbalance.

Today, no specific solution exists as how to linearize an IQ-modulator. Absence of a linearizer gives rise to added unwanted signal inter-modulation due to high power usage of the IQ-modulator. There is a need to counteract the non-linearities in order to meet specifications and at the same time keep a good power efficiency budget.

SUMMARY

An object of the present invention is an IQ-modulator pre-distortion method and pre-distorter for compensating for these errors.

A further object is a base station including such an IQ-modulator pre-distorter.

These objects are achieved in accordance with the attached claims.

Briefly, the present invention pre-distorts each IQ-vector by a 2-dimensional linear transformation that depends on the value of the IQ-vector to be pre-distorted. Thus, the transformation is different for different IQ-vectors and is preferably based on polynomials in the I- and Q-components of said IQ-vector.

BRIEF DESCRIPTION OF THE DRAWINGS

The invention, together with further objects and advantages thereof, may best be understood by making reference to the following description taken together with the accompanying drawings, in which.

DETAILED DESCRIPTION

The following description will concentrate only on elements that are relevant for explaining the present invention. Other elements, such as filters, signal encoders, channel encoder, etc., which are obvious for a person skilled in the art have been omitted to avoid cluttering of the drawings.

Figure 1:
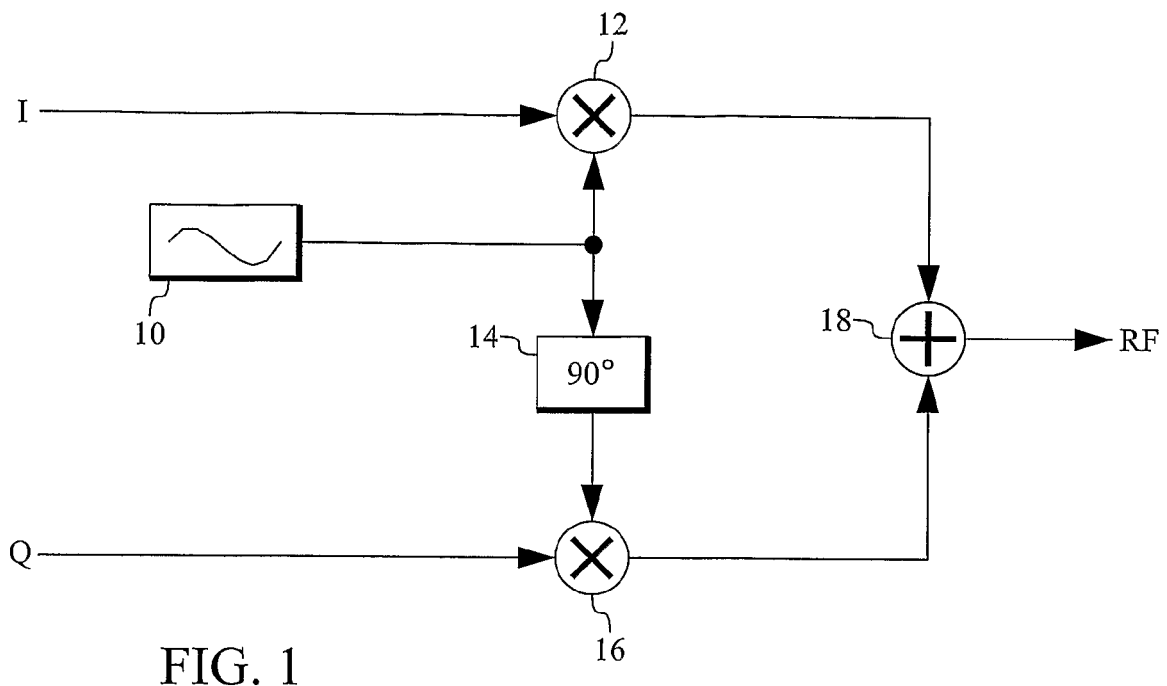
FIG. 1 is a simple block diagram illustrating the principles of an IQ-modulator.

FIG. 1 is a block diagram of an analog IQ-modulator. The IQ-modulator includes a local oscillator 10, the output signal of which multiplies the I-component of a signal that is to be transformed to RF in a mixer 12. The output signal from local oscillator 10 is also forwarded to a 90° phase shifter 14 and then to a second mixer 16 for transforming the Q-component of the input signal to RF. The transformed signals from mixers 12, 16 are then combined in an adder 18 to form the desired RF-signal.

Since the two local oscillator signals are phase shifted 90°, the two components can be regarded as being "orthogonal". If, however, there is an error in the phases of the mixing signals from the local oscillator and also a gain difference, then the I- and Q-branches are not orthogonal any longer. This will lead to leakage between the branches.

In addition to the pure orthogonality imbalance, each branch has non-linear effects. It is believed that these come from phase-modulation of the mixing signals from the local oscillator. In accordance with the present invention it is possible to extract the non-linear behavior. Preferably this is done by performing a series expansion of the mixing signals from the local oscillator in order to arrive at a polynomial representation of the non-linearity for each branch separately.

Figure 2:
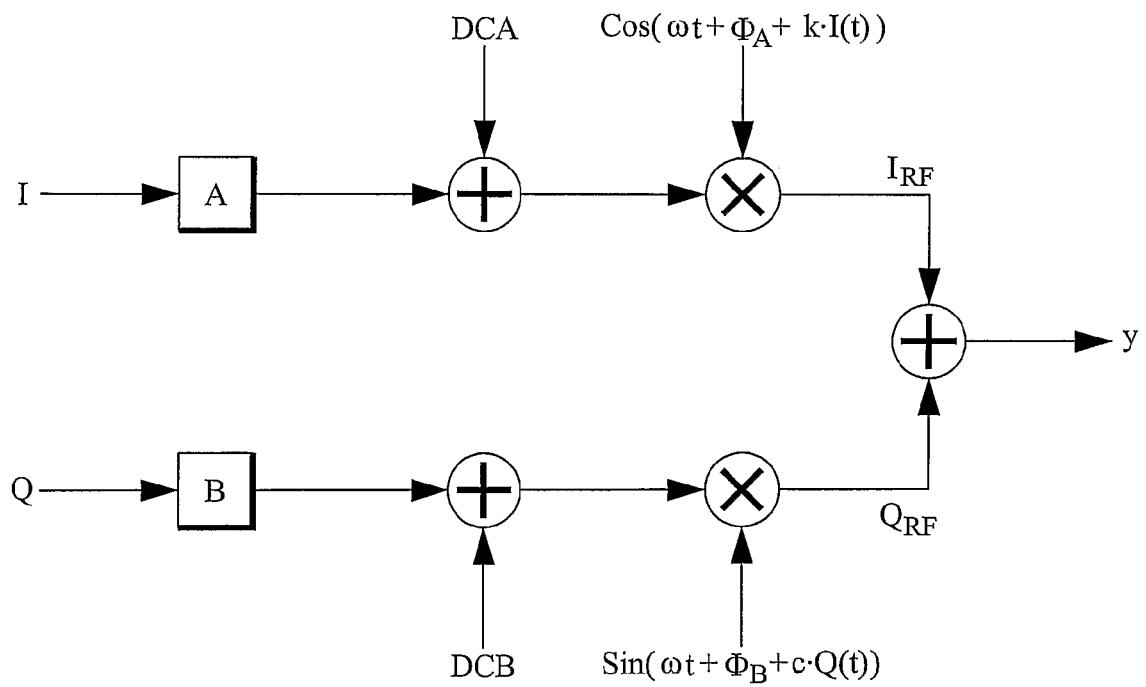
FIG. 2 is a model of an IQ-modulator illustrating various error sources.

FIG. 2 is a model of an IQ-modulator illustrating various error sources. In this model the I-component is amplified by a gain A, combined with a DC offset DCA and multiplied by a mixer signal $\cos(\omega \cdot t + \Phi_A + k \cdot I(t))$ to produce the transformed or up-converted RF-signal $I_{RF}$. The up-conversion of the Q-component is modeled in a similar way. Mathematically the model can be expressed as:

$$\begin{cases} I_{RF}(t) = (I(t) \cdot A + DCA) \cdot \cos(\omega \cdot t + \Phi_A + k \cdot I(t)) \\ Q_{RF}(t) = (Q(t) \cdot B + DCB) \cdot \sin(\omega \cdot t + \Phi_B + c \cdot Q(t)) \end{cases} \quad (1)$$

The up-converted signals are then combined to form the RF-signal:

$$y(t) = I_{RF}(t) + Q_{RF}(t) \quad (2)$$

Basically the IQ-modulator is seen as having two input ports that each has its own non-linearity. As there are two separate branches, it is necessary to have two separate non-linear compensators for this. In view of FIG. 2 the local oscillator signals each have a phase modulation, which gives frequency inter-modulation on the I- and Q-signals.

The preferred concept of the non-linear IQ-compensation in accordance with the present invention is based on polynomial expansions, or truncated series expansions, of the Sine and Cosine functions of (1) in k and c. This is justified by the fact that measured inter-modulation has been found to be of the order of 50-60 dBc. Using algebra calculations one can show (see the APPENDIX below) that, for example, for the I-branch the non-linearity leads to a polynomial expansion of the I-signal, but also of a leakage component from the Q-signal into the I-branch. Therefore, the non-linearity and leakage can be counteracted by performing the very same expansion in a pre-distorter and then also add a DC (Direct Current) component to the I-branch. It then only remains to do exactly the same with the Q-branch, i.e. to expand the Q-signal in a series (polynomial) and then to add the leakage from the I-branch this time. The leakages are of course also expanded into series form. The resulting compensation at base band may be expressed as:

$$\begin{cases} I'(t) = \alpha_0 + \alpha_1 \cdot I(t) + \alpha_2 \cdot I(t)^2 + \alpha_3 \cdot I(t)^3 \ldots + \\ \quad \alpha_4 \cdot Q(t) + \alpha_5 \cdot Q(t)^2 + \alpha_6 \cdot Q(t)^3 \ldots \\ Q'(t) = \beta_0 + \beta_1 \cdot I(t) + \beta_2 \cdot I(t)^2 + \beta_3 \cdot I(t)^3 \ldots + \\ \quad \beta_4 \cdot Q(t) + \beta_5 \cdot Q(t)^2 + \beta_6 \cdot Q(t)^3 \ldots \end{cases} \quad (3)$$

where $\alpha_0, \alpha_1, \ldots$ and $\beta_0, \beta_1, \ldots$ are constants. By factoring out $I(t)$ and $Q(t)$ this may be rewritten as:

$$\begin{cases} I'(t) = \alpha_0 + I(t) \cdot (\alpha_1 + \alpha_2 \cdot I(t) + \alpha_3 \cdot I(t)^2 \ldots) + \\ \quad Q(t) \cdot (\alpha_4 + \alpha_5 \cdot Q(t) + \alpha_6 \cdot Q(t)^2 \ldots) \\ Q'(t) = \beta_0 + I(t) \cdot (\beta_1 + \beta_2 \cdot I(t) + \beta_3 \cdot I(t)^2 \ldots) + \\ \quad Q(t) \cdot (\beta_4 + \beta_5 \cdot Q(t) + \beta_6 \cdot Q(t)^2 \ldots) \end{cases} \quad (4)$$

At a closer look, the representation in (4) can also be reverted into tabular form. Everything within the parentheses is seen to be either a function of $I(t)$ or of $Q(t)$ alone. Therefore, the following formulations is also valid for the non-linear IQ-compensation block or pre-distorter:

$$\begin{cases} I'(t) = \alpha_0 + I(t) \cdot T_{11}(I(t)) + Q(t) \cdot T_{12}(Q(t)) \\ Q'(t) = \beta_0 + I(t) \cdot T_{21}(I(t)) + Q(t) \cdot T_{22}(Q(t)) \end{cases} \quad (5)$$

Tables $T_{11}$, $T_{12}$, $T_{21}$, $T_{22}$ are real-valued tables that have been sampled at the possible digital values of I and Q, and the $\alpha_0, \beta_0$ are real-valued constants. Equation (5) may also be rewritten in matrix form as:

$$\begin{bmatrix} I'(t) \\ Q'(t) \end{bmatrix} = \begin{bmatrix} T_{11}(I(t)) & T_{12}(Q(t)) \\ T_{21}(I(t)) & T_{22}(Q(t)) \end{bmatrix} \begin{bmatrix} I(t) \\ Q(t) \end{bmatrix} + \begin{bmatrix} \alpha_0 \\ \beta_0 \end{bmatrix} \quad (6)$$

Thus, the present invention may be viewed as pre-distorting each IQ-vector by a 2-dimensional linear transformation that depends on the value of the IQ-vector itself.

Figure 3:
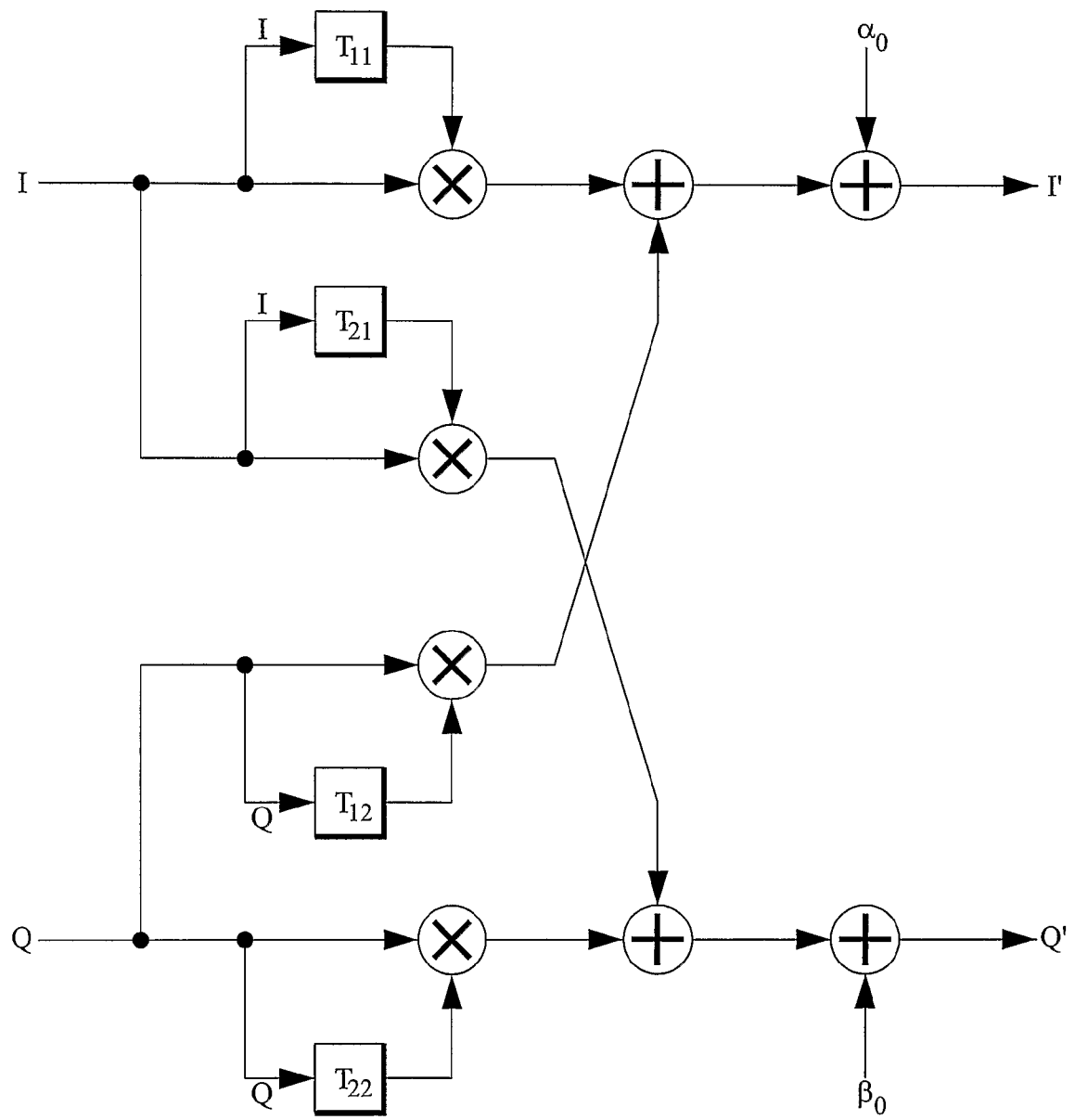
FIG. 3 is a block diagram of an embodiment of an IQ-modulator pre-distorter in accordance with the present invention.

FIG. 3 is a block diagram of an embodiment of an IQ-modulator pre-distorter in accordance with the present invention. This embodiment is based on the lookup tables in (5). The I-component is multiplied by a value from table $T_{11}$ that depends on I itself. The I-branch is also cross-coupled to the Q-branch over table $T_{21}$, which multiplies the I-component by a value from table $T_{21}$ that depends on I. The Q-component is processed in a similar way by tables $T_{22}$ and $T_{12}$. In each branch the rescaled component is then added to the cross-coupled component. Finally, the DC-offsets are added to the respective branches for obtaining the pre-distorted components I', Q'.

Figure 4:
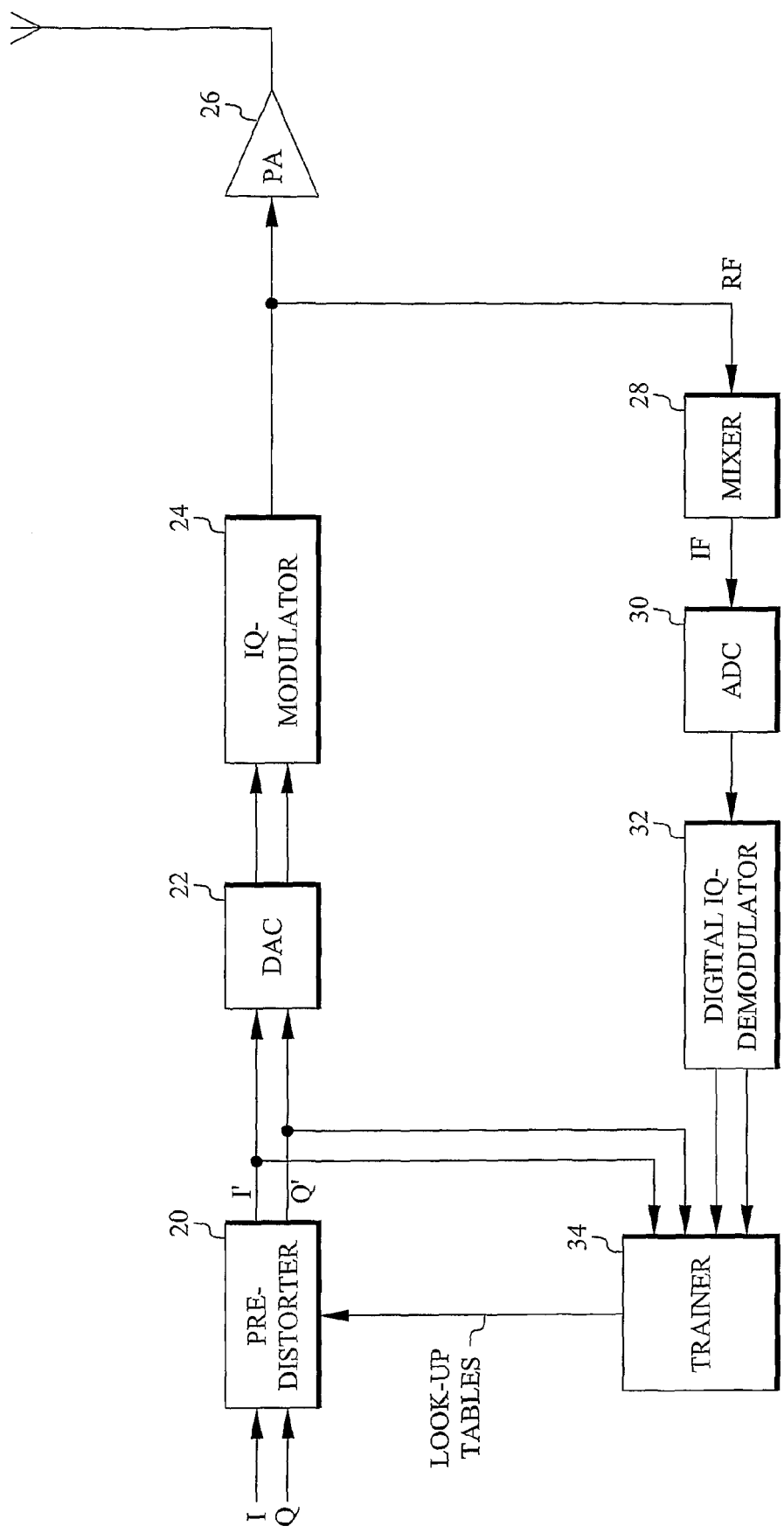
FIG. 4 is a block diagram of an embodiment of a base station including an IQ-modulator pre-distorter in accordance with the present invention.

FIG. 4 is a block diagram of an embodiment of a base station including an IQ-modulator pre-distorter in accordance with the present invention. An IQ-modulator pre-distorter 20 in accordance with the present invention is connected to a DAC 22 (Digital-to-Analog Converter). The analog pre-distorted IQ-vector is forwarded to an IQ-modulator 24, and the up-converted RF-signal is amplified by a power amplifier 26 for transmission by an antenna. The output of IQ-modulator 24 is also connected to a mixer 28, which down-converts the RF-signal to IF (Intermediate Frequency). The IF-signal is digitized in an ADC 30 (Analog-to-Digital Converter). The digitized IF-signal is further down-converted and transformed into an IQ-signal by an IQ-demodulator 32. IQ-demodulator 32 is connected to a pre-distorter trainer 34 for determining the actual pre-distortion. The pre-distorted signals I', Q' are also forwarded to trainer 34. After determining the pre-distortion, for example in accordance with the procedure described below, trainer 34 forwards the lookup table to pre-distorter 20.

The calculation of the constants $\alpha_0, \alpha_1, \ldots$ and $\beta_0, \beta_1, \ldots$, and thus of the tables and DC offsets, can be made by methods of an iterative LMS (Least Mean Squares) solution, or by direct matrix inversion to arrive at the LMS solution. The latter method is briefly described by the equations below to solve the so-called Normal Equations:

$$\underbrace{\begin{bmatrix} 1 & I & I^2 & I^3 & \ldots & Q & Q^2 & Q^3 & \ldots \\ \vdots & \vdots & \vdots & \vdots & \vdots & \vdots & \vdots & \vdots & \vdots \end{bmatrix}}_{M} \underbrace{\begin{bmatrix} \alpha_0 + j\beta_0 \\ \alpha_1 + j\beta_1 \\ \alpha_2 + j\beta_2 \\ \alpha_3 + j\beta_3 \\ \vdots \\ \alpha_4 + j\beta_4 \\ \alpha_5 + j\beta_5 \\ \alpha_6 + j\beta_6 \\ \vdots \end{bmatrix}}_{\alpha + j\beta} = \underbrace{\begin{bmatrix} I' + jQ' \\ \vdots \end{bmatrix}}_{Y} \quad (7)$$

Here each row in M and Y represents different samples of I, Q, I', Q'. Equation (7) may be written in matrix form as:

$$M \cdot (\alpha + j\beta) = Y \quad (8)$$

The solution is:

$$(\alpha + j\beta) = [M^H \cdot M]^{-1} \cdot M^H Y \quad (9)$$

where $M^H$ is the Hermitian conjugate of M.

The IQ-modulator pre-distorter in accordance with the present invention may be implemented as an FPGA (Field Programmable Gate Array) or ASIC (Application Specific Integrated Circuit). Another possibility is to use a micro processor or a micro/signal processor combination and corresponding software. The actual computation of the look-up table entries may be done in an off-line manner at a slow update speed.

Figure 5:
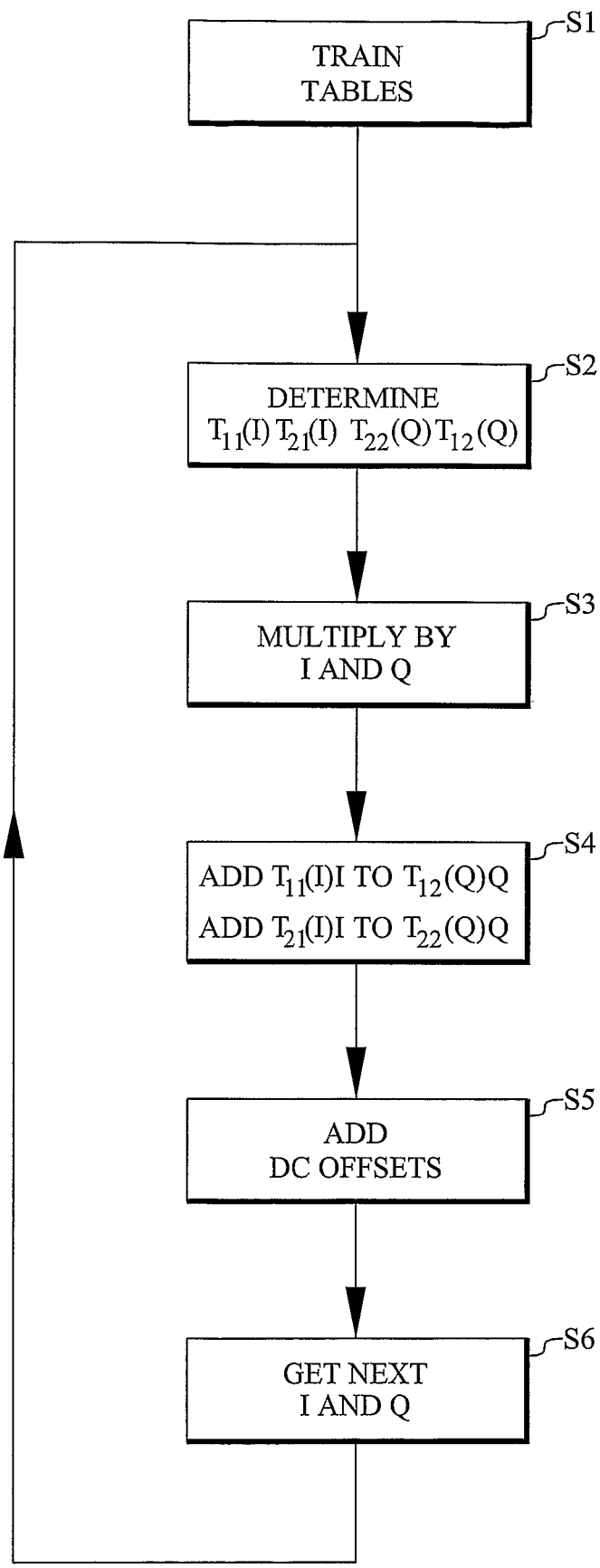
FIG. 5 is a flowchart illustrating an embodiment of the IQ-modulator pre-distortion method in accordance with the present invention.

FIG. 5 is a flowchart illustrating an embodiment of the method in accordance with the present invention. Step S1 performs a training of the lookup tables as described above. Step S2 performs the actual table lookup to determine the IQ-signal dependent table values. Step S3 multiplies these values by I and Q. Step S4 adds the rescaled I- and Q-components to their respective cross-coupled corrections. Finally step S5 adds the DC-offsets. Step S6 gets the next I- and Q-values and returns the procedure to step S2. If desired, the training in step S1 may be repeated on a regular basis or if environmental changes require a recalculation of the lookup tables.

An advantage with the compensation in accordance with the present invention for a non-linear IQ-modulator is that it counteracts inter-modulation products generated by the IQ-modulator. This means that IQ-modulator can be driven by a higher input power and therefore also the whole radio unit it supports (Transceiver+Power Amplifier) can be operated at a higher output power. The power efficiency of the whole radio unit can be kept at a high level without compromising radio spectrum performance in terms of increased inter-modulation.

It will be understood by those skilled in the art that various modifications and changes may be made to the present invention without departure from the scope thereof, which is defined by the appended claims.

APPENDIX

This appendix lists the basic mathematics behind deriving the polynomial expansions of the non-linear IQ-modulator as described above. Comments in the appendix will be held short as to highlight the mathematics alone.

In the I-branch the right hand side of the first row of (1) may be expanded in a polynomial in k as (DCA is temporarily set to 0 for convenience):

$$\left(I(t) \cdot A \cdot \cos(\Phi_A) - I(t)^2 \cdot A \cdot \sin(\Phi_A) \cdot k - \frac{1}{2} \cdot I(t)^3 \cdot A \cdot \cos(\Phi_A) \cdot k^2 + \right.$$
$$\frac{1}{6} \cdot I(t)^4 \cdot A \cdot \sin(\Phi_A) \cdot k^3 + + \frac{1}{24} \cdot I(t)^5 \cdot A \cdot \cos(\Phi_A) \cdot k^4 -$$
$$\left. \frac{1}{120} \cdot I(t)^6 \cdot A \cdot \sin(\Phi_A) \cdot k^5 \right) \cdot \cos(\omega \cdot t) +$$
$$\left(-I(t) \cdot A \cdot \sin(\Phi_A) - I(t)^2 \cdot A \cdot \cos(\Phi_A) \cdot k + \frac{1}{2} \cdot I(t)^3 \cdot A \cdot \sin(\Phi_A) \cdot k^2 + \right.$$
$$\frac{1}{6} \cdot I(t)^4 \cdot A \cdot \cos(\Phi_A) \cdot k^3 + -\frac{1}{24} \cdot I(t)^5 \cdot A \cdot \sin(\Phi_A) \cdot k^4 -$$
$$\left. \frac{1}{120} \cdot I(t)^6 \cdot A \cdot \cos(\Phi_A) \cdot k^5 \right) \cdot \sin(\omega \cdot t) + O(k^6)$$

Similarly, in the Q-branch the right hand side of the last row of (1) may be expanded in a polynomial in c as (DCB is temporarily set to 0 for convenience):

$$\left(Q(t) \cdot B \cdot \sin(\Phi_B) + Q(t)^2 \cdot B \cdot \cos(\Phi_B) \cdot c - \frac{1}{2} \cdot Q(t)^3 \cdot B \cdot \sin(\Phi_B) \cdot c^2 - \right.$$
$$\frac{1}{6} \cdot Q(t)^4 \cdot B \cdot \cos(\Phi_B) \cdot c^3 + + \frac{1}{24} \cdot Q(t)^5 \cdot B \cdot \sin(\Phi_B) \cdot c^4 +$$
$$\left. \frac{1}{120} \cdot Q(t)^6 \cdot B \cdot \cos(\Phi_B) \cdot c^5 \right) \cdot \cos(\omega \cdot t) +$$
$$\left(Q(t) \cdot B \cdot \cos(\Phi_B) - Q(t)^2 \cdot B \cdot \sin(\Phi_A) \cdot c - \frac{1}{2} \cdot I(t)^3 \cdot A \cdot \cos(\Phi_B) \cdot c^2 + \right.$$
$$\frac{1}{6} \cdot Q(t)^4 \cdot B \cdot \sin(\Phi_B) \cdot c^3 + + \frac{1}{24} \cdot Q(t)^5 \cdot B \cdot \sin(\Phi_B) \cdot c^4 -$$
$$\left. \frac{1}{120} \cdot Q(t)^6 \cdot B \cdot \sin(\Phi_B) \cdot c^5 \right) \cdot \sin(\omega \cdot t) + O(c^6)$$

These expressions may be rearranged into polynomials in I(t) and Q(t):

$$\begin{cases} \alpha_1 \cdot I(t) + \alpha_2 \cdot I(t)^2 + \alpha_3 \cdot I(t)^3 \ldots + \alpha_4 \cdot Q(t) + \alpha_5 \cdot Q(t)^2 + \alpha_6 \cdot Q(t)^3 \ldots \\ \beta_1 \cdot I(t) + \beta_2 \cdot I(t)^2 + \beta_3 \cdot I(t)^3 \ldots + \beta_4 \cdot Q(t) + \beta_5 \cdot Q(t) + \beta_6 \cdot Q(t)^2 \ldots \end{cases}$$

Reinserting the DC-offsets DCA, DCB leads to (3).

The invention claimed is:

1. An IQ-modulator pre-distortion method, said method comprising the step of pre-distorting each IQ-vector by a 2-dimensional linear transformation that depends on the value of the IQ-vector to be pre-distorted, wherein said transformation is based on polynomials in the I- and Q-components of said IQ-vector, wherein said transformation is based on a 2×2 dimensional lookup table matrix, the elements of which are sampled polynomials in the I- and Q-components of said IQ-vector, wherein one of the diagonal elements and one of the off-diagonal elements of said matrix depend on said I-component and the other diagonal element and the other off-diagonal element depend on said Q-component, and wherein said transformation is represented by the equation:

$$\begin{bmatrix} I'(t) \\ Q'(t) \end{bmatrix} = \begin{bmatrix} T_{11}(I(t)) & T_{12}(Q(t)) \\ T_{21}(I(t)) & T_{22}(Q(t)) \end{bmatrix} \begin{bmatrix} I(t) \\ Q(t) \end{bmatrix} + \begin{bmatrix} \alpha_0 \\ \beta_0 \end{bmatrix}$$

where $$\begin{bmatrix} I(t) \\ Q(t) \end{bmatrix}$$

is the IQ-vector to be pre-distorted, $$\begin{bmatrix} T_{11}(I(t)) & T_{12}(Q(t)) \\ T_{21}(I(t)) & T_{22}(Q(t)) \end{bmatrix}$$

is said matrix, $$\begin{bmatrix} \alpha_0 \\ \beta_0 \end{bmatrix}$$

is an offset vector, $$\begin{bmatrix} I'(t) \\ Q'(t) \end{bmatrix}$$

is the pre-distorted vector, and t is a variable representing time.

2. An IQ-modulator pre-distorter, comprising: means for pre-distorting each IQ-vector by a 2-dimensional linear transformation that depends on the value of the IQ-vector to be pre-distorted, wherein said transformation is based on polynomials in the I- and Q-components of said IQ-vector, wherein said transformation is based on a 2×2 dimensional lookup table matrix, the elements of which are sampled polynomials in the I- and Q-components of said IQ-vector, wherein one of the diagonal elements and one of the off-diagonal elements of said matrix depend on said I-component and the other diagonal element and the other off-diagonal element depend on said Q-component, and wherein said transformation is represented by the equation:

$$\begin{bmatrix} I'(t) \\ Q'(t) \end{bmatrix} = \begin{bmatrix} T_{11}(I(t)) & T_{12}(Q(t)) \\ T_{21}(I(t)) & T_{22}(Q(t)) \end{bmatrix} \begin{bmatrix} I(t) \\ Q(t) \end{bmatrix} + \begin{bmatrix} \alpha_0 \\ \beta_0 \end{bmatrix}$$

where $$\begin{bmatrix} I(t) \\ Q(t) \end{bmatrix}$$

is the IQ-vector to be pre-distorted, $$\begin{bmatrix} T_{11}(I(t)) & T_{12}(Q(t)) \\ T_{21}(I(t)) & T_{22}(Q(t)) \end{bmatrix}$$

said matrix, $$\begin{bmatrix} \alpha_0 \\ \beta_0 \end{bmatrix}$$

is an offset vector, $$\begin{bmatrix} I'(t) \\ Q'(t) \end{bmatrix}$$

is the pre-distorted vector, and
  t is a variable representing time, and
  means for outputting each pre-distorted IQ vector.

3. A base station including an IQ-modulator pre-distorter, said pre-distorter comprising: means for pre-distorting each IQ-vector by a 2-dimensional linear transformation that depends on the value of the IQ-vector to be pre-distorted, wherein said transformation is based on polynomials in the I- and Q-components of said IQ-vector, wherein said transformation is based on a 2×2 dimensional lookup table matrix, the elements of which are sampled polynomials in the I- and Q-components of said IQ-vector, wherein one of the diagonal elements and one of the off-diagonal elements of said matrix depend on said I-component and the other diagonal element and the other off-diagonal element depend on said Q-component, and wherein said transformation is represented by the equation:

$$\begin{bmatrix} I'(t) \\ Q'(t) \end{bmatrix} = \begin{bmatrix} T_{11}(I(t)) & T_{12}(Q(t)) \\ T_{21}(I(t)) & T_{22}(Q(t)) \end{bmatrix} \begin{bmatrix} I(t) \\ Q(t) \end{bmatrix} + \begin{bmatrix} \alpha_0 \\ \beta_0 \end{bmatrix}$$

where $$\begin{bmatrix} I(t) \\ Q(t) \end{bmatrix}$$

is the IQ-vector to be pre-distorted, $$\begin{bmatrix} T_{11}(I(t)) & T_{12}(Q(t)) \\ T_{21}(I(t)) & T_{22}(Q(t)) \end{bmatrix}$$

said matrix, $$\begin{bmatrix} \alpha_0 \\ \beta_0 \end{bmatrix}$$

is an offset vector, $$\begin{bmatrix} I'(t) \\ Q'(t) \end{bmatrix}$$

is the pre-distorted vector, and
  t is a variable representing time, and
  means for outputting each pre-distorted IQ vector.

* * * * *